(12) United States Patent
Kwon et al.

(10) Patent No.: US 8,842,484 B2
(45) Date of Patent: Sep. 23, 2014

(54) VOLTAGE GENERATOR, NONVOLATILE MEMORY DEVICE COMPRISING VOLTAGE GENERATOR, AND METHOD OF OPERATING VOLTAGE GENERATOR

(75) Inventors: Duk-Min Kwon, Seoul (KR); Ki-Whan Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 440 days.

(21) Appl. No.: 13/225,658

(22) Filed: Sep. 6, 2011

(65) Prior Publication Data

US 2012/0063244 A1    Mar. 15, 2012

(30) Foreign Application Priority Data

Sep. 10, 2010    (KR) .................. 10-2010-0089046

(51) Int. Cl.
G11C 7/00      (2006.01)
H02M 3/07      (2006.01)
G11C 5/14      (2006.01)
G11C 16/30     (2006.01)
H02M 1/00      (2006.01)
G11C 8/08      (2006.01)

(52) U.S. Cl.
CPC ........ H02M 3/073 (2013.01); *H02M 2003/075* (2013.01); *H02M 2001/009* (2013.01); *G11C 8/08* (2013.01); G11C 5/145 (2013.01); G11C 16/30 (2013.01)

USPC ................................ 365/189.11; 365/189.07

(58) Field of Classification Search
None
See application file for complete search history.

(56) References Cited

U.S. PATENT DOCUMENTS

| 6,429,725 | B1  |   | 8/2002  | Tanzawa et al. |
|-----------|-----|---|---------|----------------|
| 7,332,972 | B2  | * | 2/2008  | Vandel ............................ 331/17 |
| 7,532,061 | B2  |   | 5/2009  | Ragone et al. |
| 8,040,191 | B2  | * | 10/2011 | Hirai ............................... 331/16 |
| 2005/0094472 | A1 | * | 5/2005 | Ishikawa et al. ............... 365/226 |
| 2009/0230942 | A1 |   | 9/2009 | Tsai |

FOREIGN PATENT DOCUMENTS

| KR | 1020050006833 A | 1/2005 |
| KR | 1020060024149 A | 3/2006 |
| KR | 1020070032427 A | 3/2007 |
| KR | 100721899 B1    | 5/2007 |
| KR | 1020090036453 A | 4/2009 |
| KR | 20120010052 A   | 2/2012 |

* cited by examiner

*Primary Examiner* — Kretelia Graham
(74) *Attorney, Agent, or Firm* — Volentine & Whitt, PLLC

(57) ABSTRACT

A voltage generator comprises a first booster that generates a first high voltage, and a second booster that generates a second high voltage by boosting an external voltage. The first booster comprises a comparator that controls a boosting operation with reference to the fed back first high voltage and uses the second high voltage as a drive voltage.

17 Claims, 17 Drawing Sheets

Vext < VPP2 < VPP1

Fig. 10

<Illustrative Embodiment>

| Voltage | Vext | VPP2 | VPP1 |
|---|---|---|---|
| Exemplary Level | 1.5V | 3.0V | 6V |
| Generation | External | Internal Pump | Internal Pump |
| | Vext < VPP2 < VPP1 | | |
| Standby mode | ACT | ACT | Disable |
| Write mode | ACT | ACT | ACT |
| Driving voltage of Comparator1 | – | Vext | VPP1 (>Vext) |
| Vx | – | < Vext | > Vext |
| Divider ratio | | 3:1 | 6:2 |
| Note | High ripple detection Sensitivity on VPP1 owing to relatively small divider ratio | | |

<Conventional>

| Voltage | Vext | VPP2 | VPP1 |
|---|---|---|---|
| Exemplary Level | 1.5V | 3.0V | 6V |
| Generation | External | Internal Pump | Internal Pump |
| | Vext < VPP2 < VPP1 | | |
| Standby mode | ACT | ACT | Disable |
| Write mode | ACT | ACT | ACT |
| Driving voltage of Comparator1 | – | Vext | Vext |
| Vx | – | < Vext | < Vext |
| Divider ratio | | 3:1 | 6:1 |
| Note | Poor ripple detection sensitivity on VPP1 owing to too large divider ratio | | |

VOLTAGE GENERATOR, NONVOLATILE MEMORY DEVICE COMPRISING VOLTAGE GENERATOR, AND METHOD OF OPERATING VOLTAGE GENERATOR

CROSS-REFERENCE TO RELATED APPLICATIONS

This application claims priority under 35 U.S.C. §119 to Korean Patent Application No. 10-2010-0089046 filed on Sep. 10, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to voltage generators, nonvolatile memory devices, and voltage generating methods.

Semiconductor memory devices can be roughly divided into two categories according to whether they retain stored data when disconnected to power. These categories include volatile memory devices, which lose stored data when disconnected to power, and nonvolatile memory devices, which retain stored data when connected to power.

Volatile memory devices typically have faster read and write performance compared to nonvolatile memory devices, but they are generally not used for long term data storage due to their inability to retain stored data without power. Accordingly, nonvolatile memories are used increasingly to satisfy the ever expanding need for long term data storage.

Among nonvolatile memories, flash memory has achieved widespread popularity due to attractive features such as high integration density, low power consumption, and the ability to withstand physical shock. In addition, researchers continue to develop other types of nonvolatile memories, such as ferroelectric random access memory (FRAM), magnetic RAM (MRAM), phase change random access memory (PRAM), and resistive RAM (RRAM).

Many nonvolatile memory devices require a relatively high voltage for write operations. This high voltage is generally provided through the use of a charge pump. The charge pump, however, can generate a large current, producing noise in the nonvolatile memory devices and deteriorating the reliability of the write operations. Consequently, improved techniques are needed to ensure reliability of the nonvolatile memory devices during generation of the high voltage.

SUMMARY OF THE INVENTION

According to one embodiment of the inventive concept, a voltage generator comprises a first booster that generates a first high voltage, and a second booster that generates a second high voltage by boosting an external voltage. The first booster comprises a comparator that controls a boosting operation with reference to a fed back version of the first high voltage and uses the second high voltage as a drive voltage.

According to another embodiment of the inventive concept, a nonvolatile memory device comprises a memory cell array, a write driver that writes data in the memory cell array, a sense amplifier that reads data written in the memory cell array, and a voltage generator that provides a first high voltage to the write driver and a second high voltage to the sense amplifier, wherein the voltage generator comprises a comparator that controls a boosting operation with reference to the fed back first high voltage and uses the second high voltage as a drive voltage.

According to another embodiment of the inventive concept, a method of operating a voltage generator comprises operating a first booster to generate a first high voltage, operating a second booster to generate a second high voltage by boosting an external voltage, and controlling a boosting operation of the first booster using a comparator that compares a fed back version of the first boosting voltage with a reference voltage and uses the second high voltage as a drive voltage.

These and other embodiments can improve the reliability of write operations performed by a nonvolatile memory device by providing a more stable write voltage.

BRIEF DESCRIPTION OF THE DRAWINGS

The drawings illustrate non-exhaustive and non-limiting embodiments of the inventive concept. Together with the description, they serve to explain principles of the inventive concept. In the drawings, like reference numbers indicate like features.

FIG. 10 is a table diagram illustrating a comparison between technical specifications of a conventional voltage generator and an embodiment of the inventive concept.

DETAILED DESCRIPTION

Embodiments of the inventive concept are described below with reference to the accompanying drawings. These embodiments are presented as teaching examples and should not be construed to limit the scope of the inventive concept. Although certain embodiments are described below with reference to a PRAM, embodiments of the inventive concept are not limited to this type of nonvolatile memory.

Figure 1:
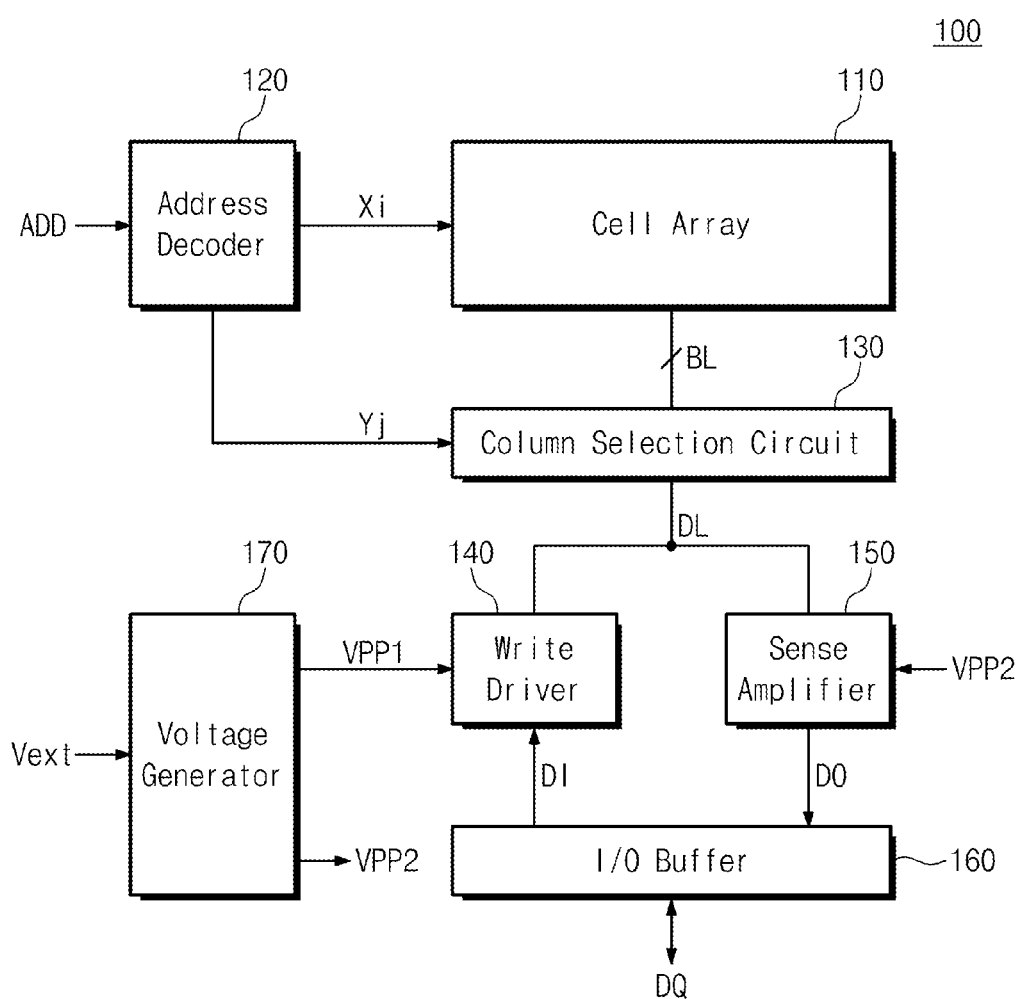
FIG. 1 is a block diagram illustrating a nonvolatile memory device according to an embodiment of the inventive concept.

FIG. 1 is a block diagram illustrating a nonvolatile memory device 100 according to an embodiment of the inventive concept.

Referring to FIG. 1, nonvolatile memory device 100 comprises a cell array 110, an address decoder 120, a column selection circuit 130, a write driver 140, a sense amplifier 150, an input/output buffer 160, and a voltage generator 170.

Cell array 110 comprises nonvolatile memory cells. For example, cell array 110 can comprise memory cells forming a resistive memory such as a PRAM, an RRAM, a nano floating gate memory (NFGM), a polymer random access memory (PoRAM), an MRAM, or an FRAM.

The memory cells in cell array 100 are selected by a row address Xi and a column address Yj. At least one word line is selected by row address Xi and at least one bit line BL is selected by column address Yj.

Address decoder 120 receives an address ADD and decodes the received address to produce row address Xi and column address Yi. Address decoder 120 selects one of a plurality of word lines according to row address Xi. Additionally, address decoder 120 delivers column address Yj to column selection circuit 130.

Column selection circuit 130 selects one of a plurality of bitlines BL and connects a data line DL to the selected bit line BL according to column address Yj.

Write driver 140 receives input data DI from input/output buffer 160 during a program operation. Write driver 140 generates a write current to write data DI to a selected memory cell. In a PRAM, for example, the write current is a set current i_SET or a reset current i_RST, depending on the value of input data DI. To generate set current i_SET or reset current i_RST, a voltage higher than an internal power voltage of nonvolatile memory device 100 is required. Accordingly, write driver 140 receives a first high voltage VPP1, which is higher than an internal power voltage (e.g., about 1.5 V), from voltage generator 170 and uses first high voltage VPP1 for the program operation.

Sense amplifier 150 senses data written in a selected memory cell, converts the sensed data into a binary logic value through amplification, and delivers it to input/output buffer 160. Sense amplifier 150 precharges data line DL with a high voltage VPP2 to read data of the selected memory cell. Sense amplifier 150 compares a develop voltage of the precharged data line DL to a reference voltage. Sense amplifier 150 determines whether data written on a memory cells is logic 0 or logic 1 according to the comparison. Voltage generator 170 provides high voltage VPP2 to sense amplifier 150 to precharge data line DL.

Input/output buffer 160 temporarily stores input data DI and delivers it to write driver 140. Input/output buffer 160 temporarily stores output data DO provided from sense amplifier 150 and delivers it to an external destination.

Voltage generator 170 generates first high voltage VPP1 provided to write driver 140 and second high voltage VPP2 provided to sense amplifier 150. Voltage generator 170 raises an external voltage Vext provided to a power terminal of nonvolatile memory device 100 to generate first high voltage VPP1 and second high voltage VPP2. Accordingly, in order to provide first high voltage VPP1 and second high voltage VPP2 used in respectively different operating modes, an additional boost circuit generating additional respective voltages is required.

First voltage VPP1 is provided to allow write driver 140 to generate a write pulse. Accordingly, first high voltage VPP1 is relatively higher than second high voltage VPP2. Generally, a charge pump is used to raise power voltage Vext to a high voltage. The charge pump performs a stable boost operation with feedback of an output terminal voltage, such as first high voltage VPP1. As the level of a fed back voltage increases, a ripple in high voltage VPP1 may be accurately and promptly sensed.

Voltage generator 170 reduces a level drop of an output high voltage and feeds back the output high voltage. This increases the sensitivity of ripple detection in the output high voltage by voltage generator 170. Configurations and technical features that can be used to provide those functions will be described in more detail with reference to FIG. 2.

Figure 2:
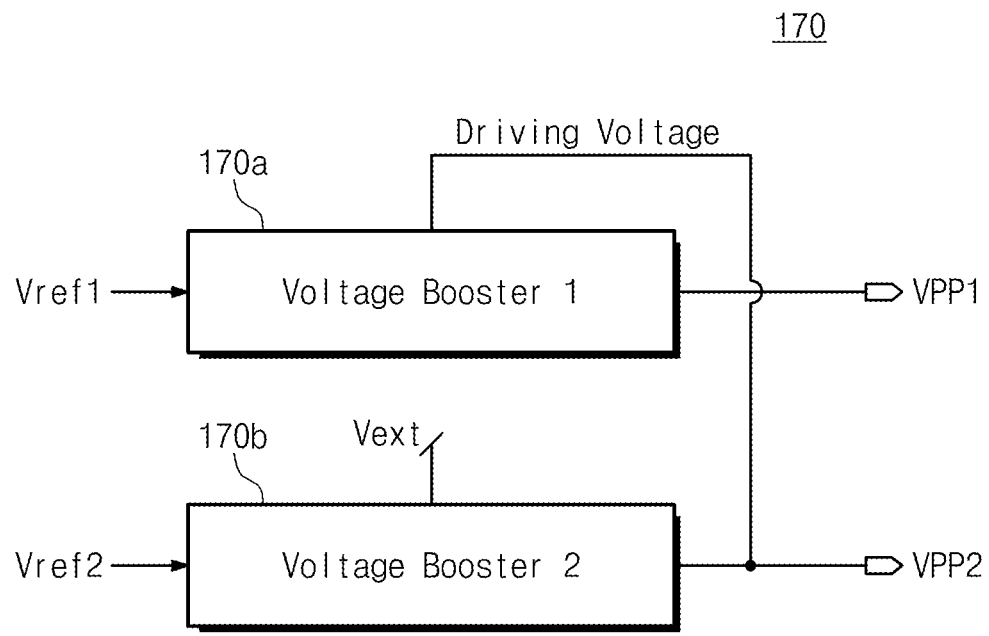
FIG. 2 is a block diagram illustrating an example configuration of a voltage generator of FIG. 1.

FIG. 2 is a block diagram illustrating a configuration of voltage generator 170 of FIG. 1. Referring to FIG. 2, voltage generator 170 comprises a first booster 170a and a second booster 170b.

First booster 170a generates first high voltage VPP1 for generating a write pulse. First booster 170a uses second high voltage VPP2, which is an output of second booster 170b, as a drive voltage. In order for first booster 170a to accurately output first high voltage VPP1, a feedback of first high voltage VPP1 is required. Additionally, to maximize a feedback effect, the level drop of a fed back first high voltage VPP1 should be minimized.

To satisfy the above conditions, a drive voltage level of a detection circuit (not shown) receiving a fed back voltage should be greater than the fed back voltage. The fed back voltage stabilizes a voltage level based on a first reference voltage Vref1. Where second high voltage VPP2 is used as a drive voltage of first booster 170a, these requirements may be satisfied.

Second booster 170b generates second high voltage VPP2 to be used as a precharge voltage of sense amplifier 150. Second booster 170b uses an external voltage Vext provided from the external of nonvolatile memory device 100, as a drive voltage. Second booster 170b feeds the second high voltage back to stabilize an output level. Second booster 170b compares a second reference voltage Vref2 to a level of the fed back high voltage and then stabilizes a level of the output high voltage VPP2.

Figure 3:
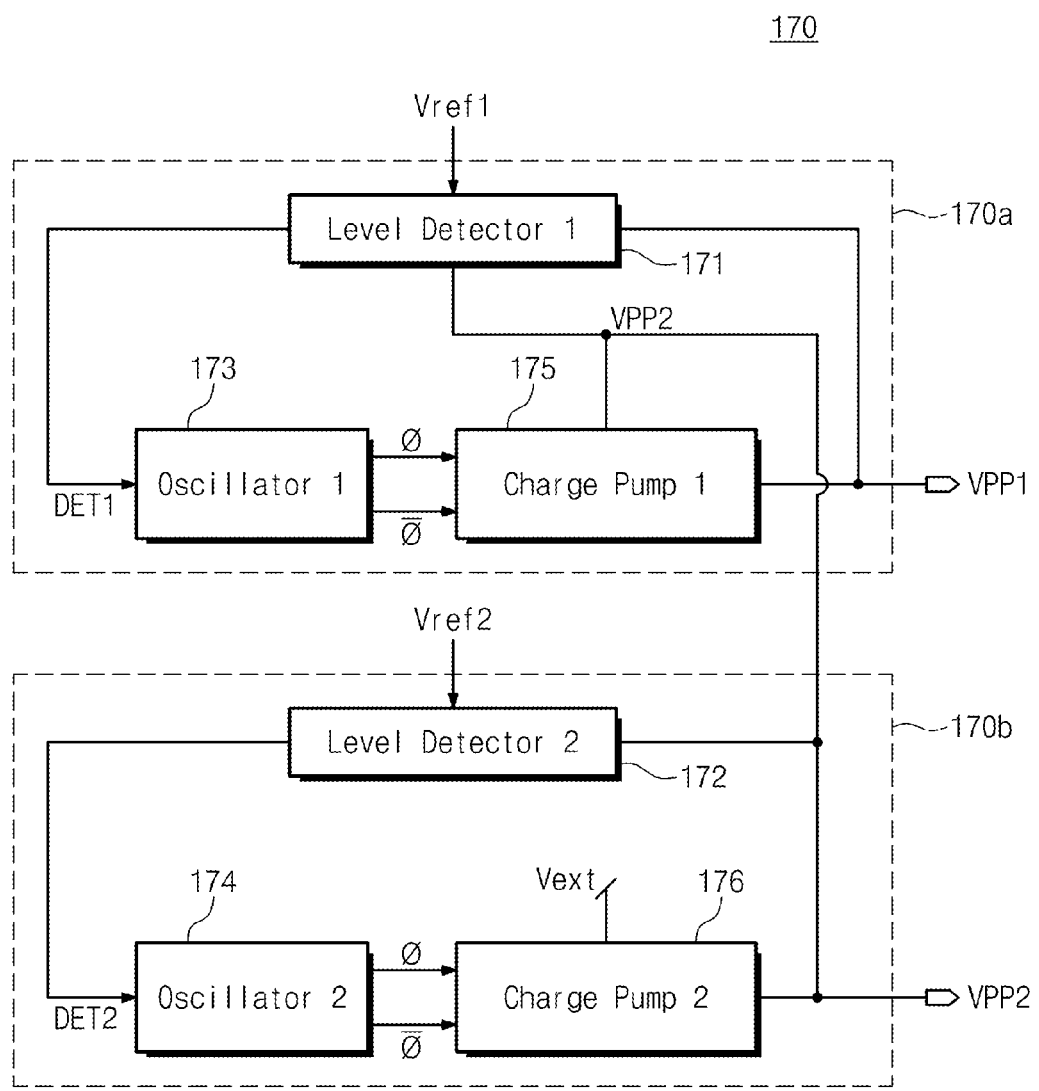
FIG. 3 is a block diagram illustrating an example of the voltage generator of FIG. 2.

FIG. 3 is a block diagram illustrating an example of voltage generator 170 of FIG. 2.

Referring to FIG. 3, voltage generator 170 comprises first booster 170a for generating first high voltage VPP1 and second booster 170b for generating a second high voltage. First booster 170a and second booster 170b stabilize an output voltage by controlling an output of an oscillator.

First booster 170a comprises a first level detector 171, a first oscillator 173, and a first charge pump 175. First level detector 171 receives feedback of an output first high voltage VPP1.

First level detector 171 monitors a level of the fed back first high voltage VPP1 with reference to first reference voltage Vref1. Where the level of first high voltage VPP1 falls below first reference voltage Vref1, first level detector 171 activates a control signal DET1. Here, the fed back first high voltage VPP1 may drop at a predetermined rate to compare it with first reference voltage Vref1. In this case, first level detector 171 may further comprise a buck circuit for dropping a fed back first high voltage VPP1.

First oscillator 173 generates pumping clocks Φ and /Φ for adjusting a charge pumping amount of first charge pump 175 in response to a control signal DET1. Pumping clocks Φ and /Φ are complementary to each other. Once control signal DET1 is activated, first oscillator 173 outputs pumping clocks Φ and /Φ. Additionally, once control signal DET1 is activated, first oscillator 173 raises the frequencies of pumping clocks Φ and /Φ.

First charge pump 175 pumps electric charges according to pumping clocks Φ and /Φ. First charge pump 175 uses second high voltage VPP2 as an input voltage for boosting, which causes the boosting speed of first charge pump 175 to become higher than when external voltage Vext is used as an input voltage. An example circuit structure of first charge pump 175 is described in further detail below.

Second booster 170b comprises a second level detector 172, a second oscillator 174, and a second charge pump 176.

Second level detector 172 receives feedback from an output second high voltage VPP2. Second level detector 172 monitors a level of the fed back second high voltage VPP2 with reference to a second reference voltage Vref2. Where a level of second high voltage VPP2 falls below second reference voltage Vref2, second level detector 172 activates a control signal DET2. Here, the fed back second high voltage VPP2 can drop at a predetermined rate to compare it with second reference voltage Vref2. In this case, second level detector 172 can further comprise a buck circuit for dropping a fed back second high voltage VPP2.

Second oscillator 174 generates pumping clocks Φ and /Φ to adjust a charge pumping amount of second charge pump 176 in response to a control signal DET2. Pumping clocks Φ and /Φ are complementary to each other. Once control signal DET2 is activated, second oscillator 174 outputs pumping clocks Φ and /Φ. Additionally, once control signal DET2 is activated, second oscillator 174 raises the frequencies of pumping clocks Φ and /Φ.

Second charge pump 176 pumps electric charges according to pumping clocks Φ and /Φ. Second charge pump 176 uses external voltage Vext as an input voltage for boosting.

Voltage generator 170 is configured to use high voltage VPP2 output by second booster 170b as a drive voltage of first booster 170a. Accordingly, a level of a feedback voltage of first booster 170a is increased and a boost speed of the charge pump is increased. As the level of a feedback voltage is increased, sensitivity for a ripple occurring in an output of first booster 170a is increased, and the stability of first high voltage VPP1 is improved.

Figure 4:
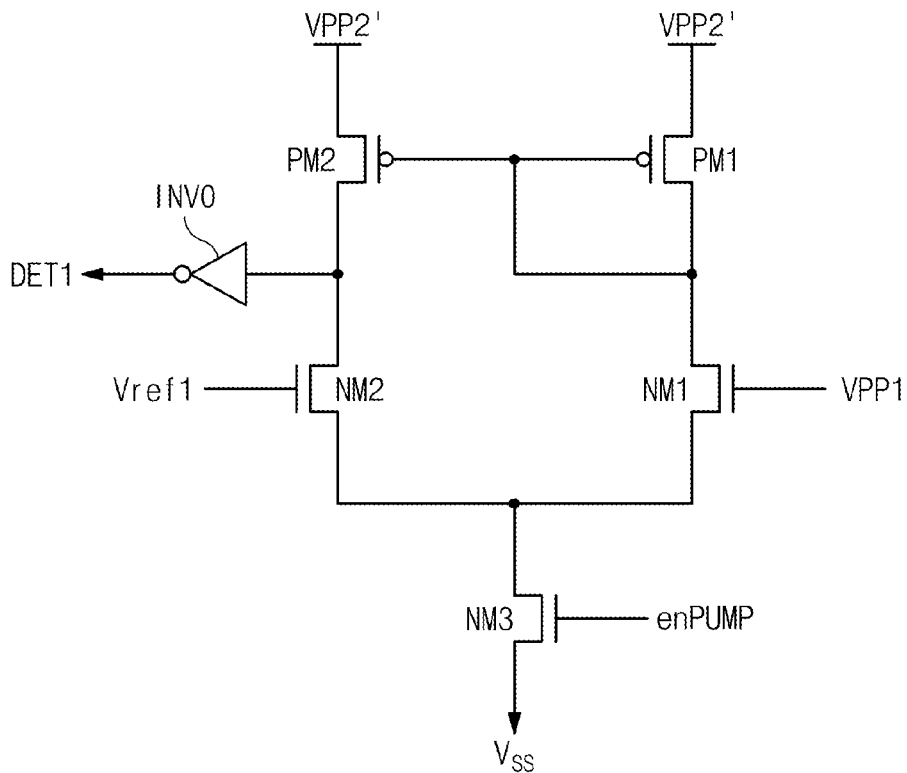
FIG. 4 is a circuit diagram illustrating an example configuration of a first level detector of FIG. 3.

FIG. 4 is a circuit diagram illustrating an example of first level detector 171 of FIG. 3. In the example of FIG. 4, first level detector 171 comprises a differential amplifier.

Referring to FIG. 4, first level detector 171 is activated by a pumping enable signal enPUMP and receives a high voltage VPP2' as a drive voltage. High voltage VPP2' is provided with the same level as second high voltage VPP2, or with a level of second high voltage VPP2 after it drops at a predetermine rate. The example of first level detector 171 may operate as follows.

Where first high voltage VPP1 output from first booster 170a is higher than first reference voltage Vref1, current discharged through a transistor NM1 becomes greater than that discharged through a transistor NM2. Then, transistors PM1 and PM2 are turned on so that a control signal DET1 is output as logic 0. On the other hand, where first high voltage VPP1 is lower than first reference voltage Vref1, current discharged through transistor NM2 becomes greater than that discharged through transistor NM1. Then, control signal DET1 is output as logic 1.

Figure 5:
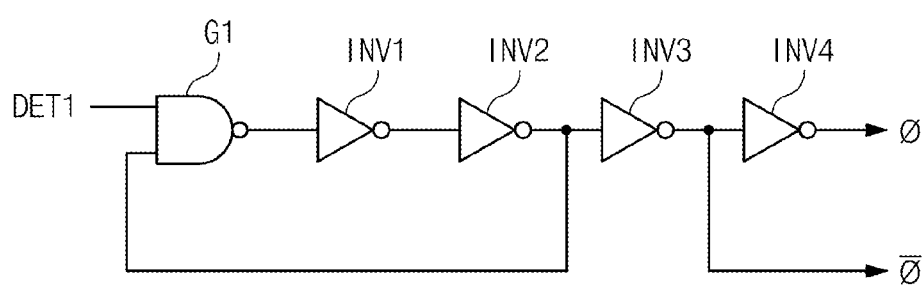
FIG. 5 is a circuit diagram illustrating an example configuration of a first oscillator of FIG. 3.

FIG. 5 is a circuit diagram illustrating an example of first oscillator 173 of FIG. 3. In the example of FIG. 5, first oscillator 173 takes the form of a pulse generator.

Referring to FIG. 5, a NAND gate G1 receives a control signal DET1 and a delayed output of NAND gate G1. Moreover, an output of NAND gate G1 through a plurality of inverters INV1 to INV3 is generated as pumping clock /Φ in an output terminal of inverter INV3. An output terminal of inerter INV4 outputs pumping clock Φ.

The example of first oscillator 173 shown in FIG. 5 can be modified in various ways. For example, in various alternatives, first and second oscillators 173 and 174 can comprise an LC oscillation circuit, an RC oscillation circuit, and various oscillation circuits using a quartz vibrator.

Figure 6:
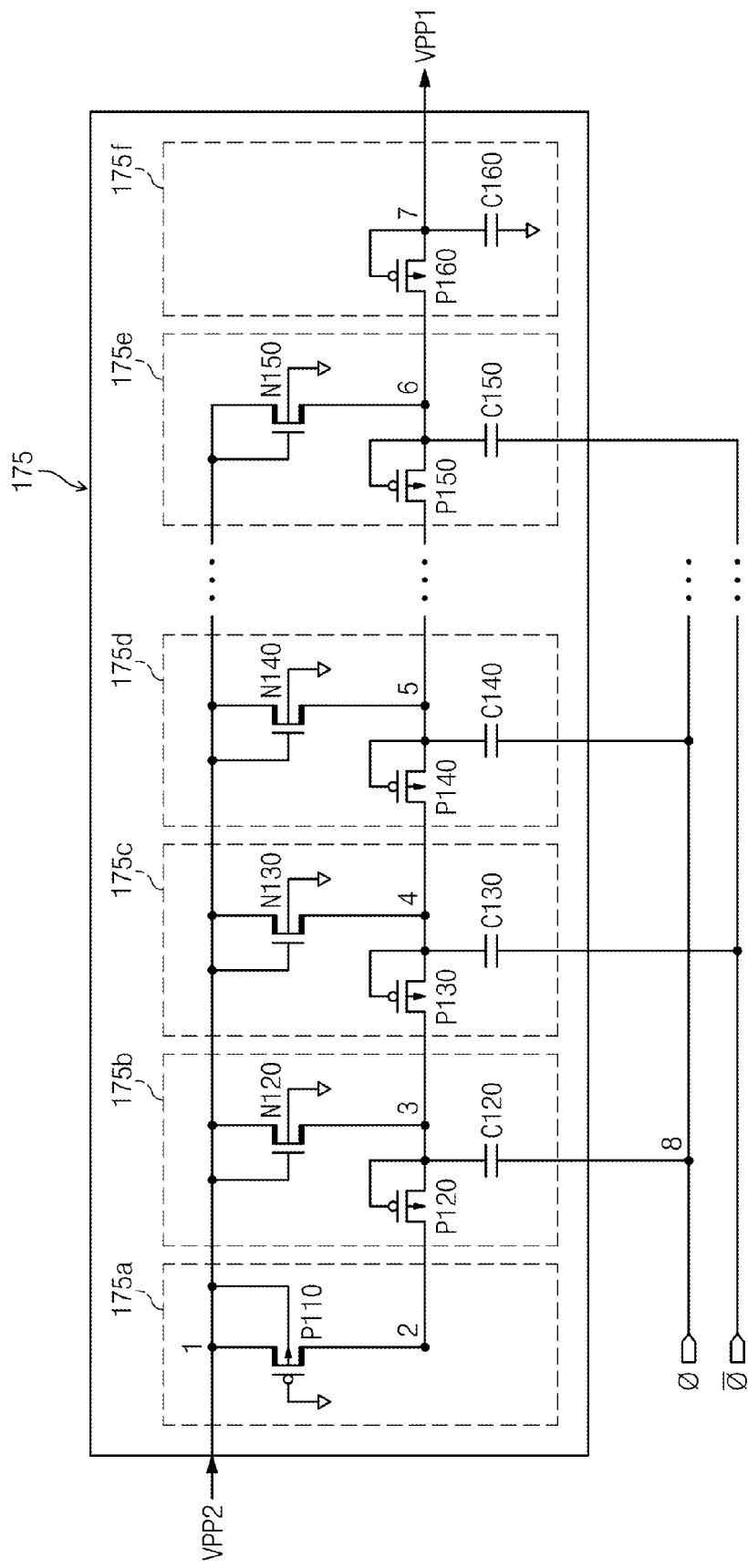
FIG. 6 is a circuit diagram illustrating an example configuration of a first charge pump of FIG. 3.

FIG. 6 is a circuit diagram illustrating an example configuration of first charge pump 175 of FIG. 3. Referring to FIG. 6, first charge pump 175 comprises a charge supply terminal 175a, charge pump terminals 175b, 175c, 175d, and 175e, and a charge storage terminal 175f.

Charge supply terminal 175a comprises a PMOS transistor P110. To provide tolerance against high voltages, PMOS transistor P110 comprises a high voltage PMOS transistor. High voltage PMOS transistor P110 is connected between a node 1 and a node 2. A source terminal and a bulk terminal of high voltage PMOS transistor P110 are connected to node 1, its drain terminal is connected to node 2, and its gate is connected ground GND. A voltage input to charge supply terminal 175a is second high voltage VPP2. Charge supply terminal 175a is used as a charge supply device and supplies charge to first charge pump terminal 175b at the next terminal.

Each of charge pump terminals 175b, 175c, 175d, and 175e comprises one PMOS transistor, one capacitor, and one high voltage NMOS transistor. The high voltage NMOS transistor is designed to tolerate second high voltage VPP2. Odd (or even) pump terminals among the plurality of charge pump terminals operate in response to pumping clock Φ and even (or odd) pump terminals operate in response to pumping clock /Φ.

For convenience of description, only first charge pump terminal 175b will be described. However, the remaining pump terminals operate in a similar manner. A source terminal of PMOS transistor P120 used as a charge delivering device is connected to node 2. Drain and gate terminals of PMOS transistor P120 are connected to node 3, and a bulk terminal of PMOS transistor P120 is in a floating state.

Capacitor C120, which is used as a charge pumping device, is connected between a node 3 and a node 8, and pumping clock Φ is applied to capacitor C120. A gate terminal and a drain terminal of high voltage NMOS transistor N120 used as a precharge device is connected to node 1, its source terminal is connected to node 3, and its bulk is connected to ground GND. High voltage NMOS transistor N120 precharges charges corresponding to second high voltage VPP2. For example, if a threshold voltage of high voltage NMOS transistor N120 is Vth, charges corresponding to VPP2-Vth are precharged to node 3.

Charge storage terminal 175f comprises one PMOS transistor P160 and one capacitor. Here, PMOS transistor P160 is used as a charge delivering device and capacitor 160 is used as a charge storing device. Output voltage VPP1 is output at a connection between PMOS transistor P160 and capacitor 160.

Figure 7:
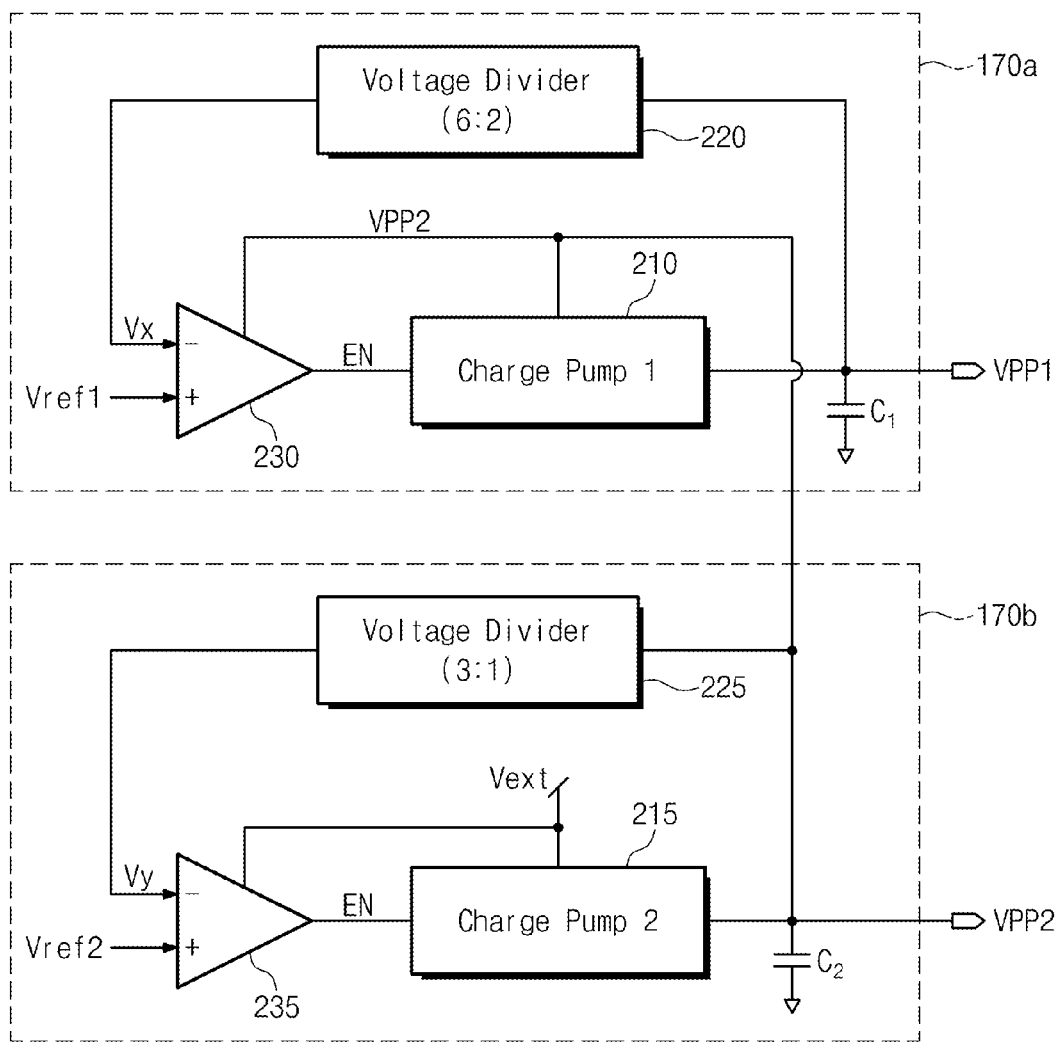
FIG. 7 is a block diagram illustrating a variation of the voltage generator of FIG. 3.

FIG. 7 is a block diagram illustrating another example of voltage generator 170 of FIG. 3.

Referring to FIG. 7, voltage generator 170 comprises first booster 170a for generating a first high voltage VPP1 and second booster 170b for generating a second high voltage.

First booster 170a comprises a first charge pump 210, a first voltage divider 220, and a first comparator 230. First booster 170a uses second high voltage VPP2 output from second booster 170b as a drive voltage. Second high voltage VPP2 can be used as a drive voltage of first charge pump 210 and first comparator 230.

First charge pump 210 uses second high voltage VPP2 as an input voltage to generate first high voltage VPP1. First charge pump 210 accumulates charges in response to an enable signal EN output from first comparator 230. First charge pump 210 outputs first high voltage VPP1 based on the accumulated charges.

Second booster 170b maintains an activated state in a write mode, a read mode, and a standby mode. Accordingly, second high voltage VPP2 can be immediately provided in a write mode upon activation of first booster 170a. Also, because the already boosted second high voltage VPP2 is used as an input voltage, a boost speed of first charge pump 210 can be increased and its output more stabilized.

First voltage divider 220 adjusts a level of first high voltage VPP1 to feed first high voltage VPP1 back to first comparator 230. For example, first voltage divider 220 divides first high voltage VPP1 and outputs it as a feedback voltage Vx. First high voltage VPP1 is too high to be provided to an input of first comparator 230. Accordingly, it is typically fed back through a voltage divide operation.

Where voltage-divided feedback voltage Vx is too low, a feedback effect may not be sufficient. For example, where first high voltage VPP1 of about 6V is divided with a ratio of 6:1 (a six resistance tap structure), feedback voltage Vx of about 1 V is output. This condition reduces the size of a ripple in first high voltage VVP1 by a 6:1 ratio. Similarly, if a size ΔVVP1 of a ripple occurring in first high voltage VPP1 is about 0.6V, a size of a ripple reflected on feedback voltage Vx is about 0.1V.

Where first high voltage VPP1 of about 6V is divided with a ratio of 6:2 (a six resistance tap structure), feedback voltage Vx of about 2V is output. This condition reduces the size of a ripple in first high voltage VVP1 by a 6:2 ratio. Similarly, if a size ΔVVP1 of a ripple in first high voltage VPP1 is about 0.6V, a size of a ripple reflected on feedback voltage Vx is about 0.2V. A size of a feedback value for a ripple having the same size varies. More feedback effects can be expected with the voltage divide of the 6:2 ratio. First voltage divider 220 divides first high voltage VPP1 through the voltage divide with a ratio (e.g., a 6:2 divide ratio) for improving a feedback effect (detection of a ripple).

First comparator 230 compares feedback voltage Vx with first reference voltage Vref1. First comparator 230 activates enable signal EN when a level of feedback voltage Vx falls below first reference voltage Vref1. First comparator 230 deactivates enable signal EN when a level of feedback voltage Vx is greater than or equal to first reference voltage Vref1.

Feedback voltage Vx input to first comparator 230 may be increased by adjusting a divide ratio. Generally, in a comparator comprising a differential amplifier or an operation amplifier, a level of each of differential input voltages is configured not to exceed a drive voltage.

Where the level of a differential input signal exceeds a drive voltage, distortion occurs in an output of the comparator. A relatively high feedback voltage Vx is input to first comparator 230. For example, with external voltage Vext at about 1.5V, feedback voltage Vx may be provided at about 2V. As second high voltage VPP2 is provided as a drive voltage of first comparator 230, distortion due to a level increase of feedback voltage Vx is reduced. A level of first reference voltage Vref1 should be raised according to a level of feedback voltage Vx.

Second booster 170b uses external voltage Vext as a drive voltage and outputs second high voltage VPP2 to circuits of a memory device during operating modes such as read, write, and standby modes. Second booster 170b comprises a second charge pump 215, a second voltage divider 225, and a second comparator 235.

Second charge pump 215 generates second high voltage VPP2 using external voltage Vext as a source voltage. Second charge pump 215 accumulates charges in response to enable signal EN output from second comparator 235, and it outputs second high voltage VPP2 based on the accumulated charges.

Second voltage divider 225 adjusts a level of second high voltage VPP2 and feeds the adjusted second high voltage VPP2 back to second comparator 235 as a feedback voltage Vy. Second voltage divider 225 divides second high voltage VPP2 of about 3V by a 3:1 ratio. Then, feedback voltage Vy of about 1V is output by second voltage divider 225. Accordingly, a level of second reference voltage Vref2 is provided with about 1V.

Second comparator 235 compares feedback voltage Vy with second reference voltage Vref2 and activates enable signal EN if feedback voltage Vy is lower than second reference voltage Vref2. Second comparator 235 deactivates enable signal EN if feedback voltage Vy is greater than or equal to second reference voltage Vref2.

In the embodiment of FIG. 7, voltage generator 170 uses activated second high voltage VPP2 as a drive voltage of first charge pump 210 and first comparator 230. This can provide various benefits. First, it raises sensitivity to a ripple of first comparator 230, so it provides a stable first high voltage VPP1. Second, because a primarily raised second high voltage VPP2 is used as a voltage source of first charge pump 210, a target voltage may be generated at a high speed.

Figure 8:
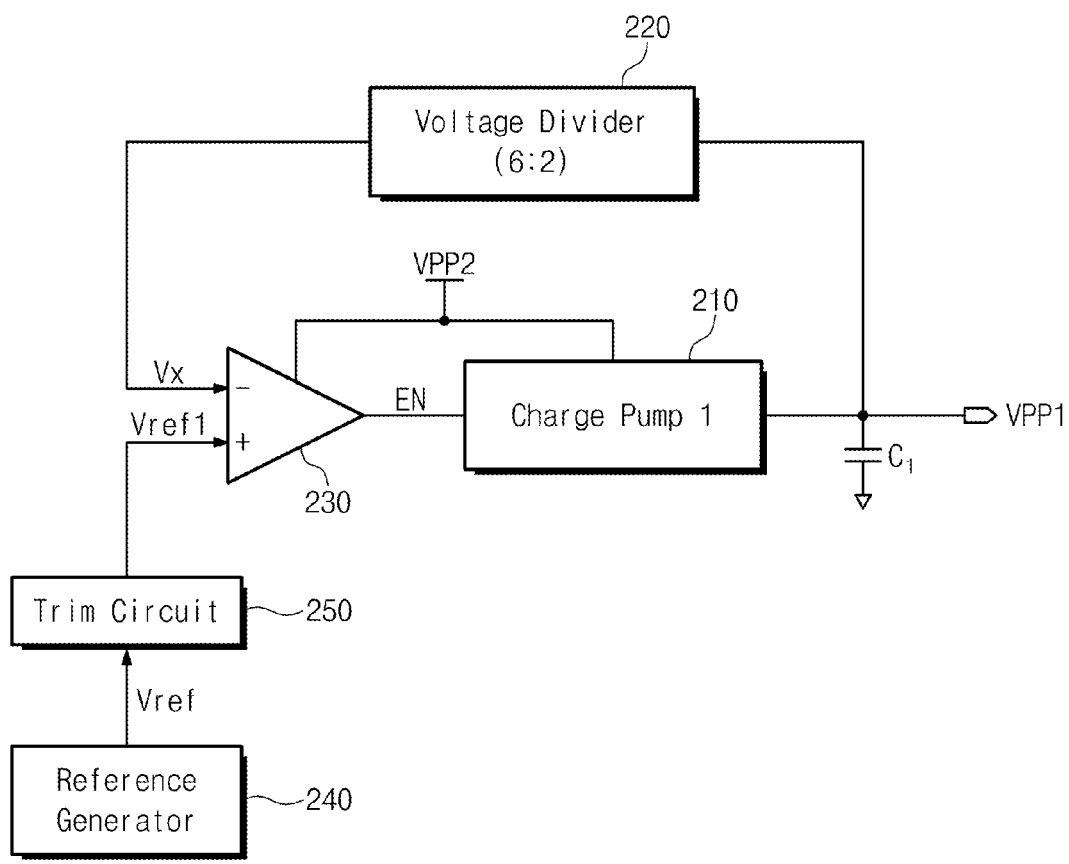
FIG. 8 is a block diagram illustrating a variation of a first booster of FIG. 7.

FIG. 8 is a block diagram illustrating an alternative example of first booster 170a of FIG. 7.

Referring to FIG. 8, first booster 170a comprises components for generating first reference voltage Vref1 corresponding to a level rise of feedback voltage Vx. First booster 170a comprises first charge pump 210, first voltage divider 220, first comparator 230, a reference voltage generator 240, and a trim circuit 250.

First booster 170a uses second high voltage VPP2 as a source voltage to generate first high voltage VPP1. First charge pump 210 generates first high voltage VPP1 using second high voltage VPP2 as a source voltage. First charge pump 210 accumulates charges in response to an enable signal EN output from first comparator 230.

First voltage divider 220 adjusts a level of first high voltage VPP1 and feeds high voltage VVP1 back to first comparator 230. Using the above-mentioned 6:2 divide ratio, more feedback effects can be expected. First voltage divider 220 divides first high voltage VPP1 by a ratio (e.g., a 6:2 divide ratio) to improve a feedback effect, such as detection of a ripple.

First comparator 230 compares feedback voltage Vx with first reference voltage Vref1. First comparator 230 activates enable signal EN when feedback voltage Vx falls below first reference voltage Vref1, and it deactivates enable signal EN when a level of feedback voltage Vx is greater than or equal to first reference voltage Vref1.

According to the level of feedback voltage Vx, a level adjustment of first reference voltage Vref1 may be required. The level of a reference voltage provided from reference voltage generator 240 may be limited. In this case, first reference voltage Vref1 for monitoring a level change of feedback voltage Vx needs to be boosted with a value of about 1.5V to about 2V.

Trim circuit 250 is used to adjust reference voltage Vref output from reference voltage generator 240 to a level for first comparator 230. Trim circuit 250 can comprise a circuit such as a fuse option for adjusting a reference voltage Vref to first reference voltage Vref1. Alternatively, trim circuit 250 can comprise a voltage regulator or boosting circuit for boosting reference voltage Vref to first reference voltage Vref1 of a proper level.

Figure 9:
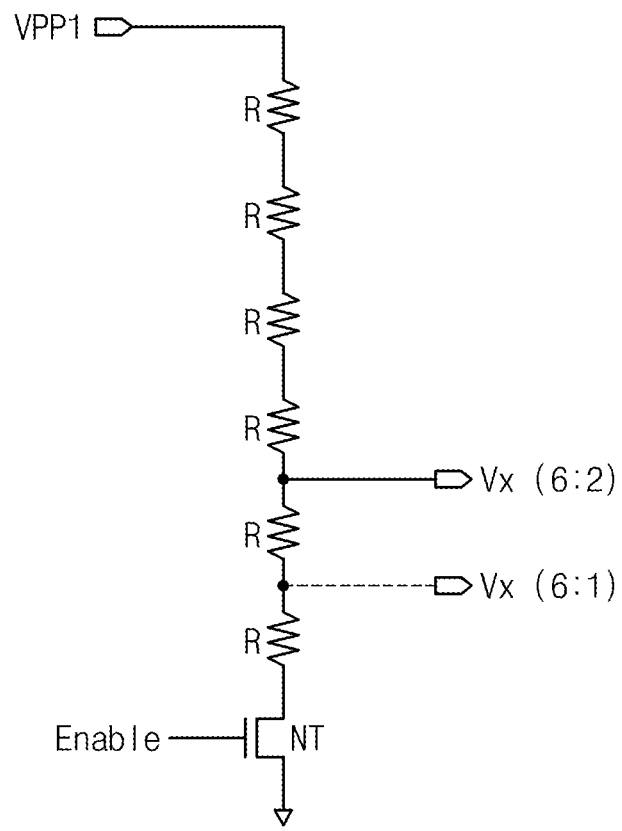
FIG. 9 is a circuit diagram illustrating an example of a first voltage divider of FIG. 8.

FIG. 9 is a circuit diagram illustrating an example of first voltage divider 220 of FIG. 8. Referring to FIG. 9, first voltage divider 220 comprises a plurality of resistors R and an NMOS transistor NT, which are connected in series. Resistors R can be formed by devices having the same resistance value and connected in series. For example, a plurality of transistors can be connected in series to form a resistor chain.

Where first high voltage VPP1 input to first voltage divider 220 is divided with a 6:1 ratio, feedback voltage Vx theoretically corresponds to (VPP1)/6. Additionally, where first high voltage VPP1 is divided with a 6:2 ratio, feedback voltage Vx theoretically corresponds to (VPP1)/3.

FIG. 10 is a table diagram illustrating a comparison between technical specifications of a conventional voltage generator and a voltage generator according to an embodiment of the inventive concept.

In the example of FIG. 10, it is assumed that a nonvolatile memory device receives a first high voltage VPP1 of about 6V, a second high voltage VPP2 of about 3V, and an external voltage Vext of about 1.5V. In a standby mode or a read mode of the nonvolatile memory device, first high voltage VPP1 is deactivated. First high voltage VPP1 is activated only in a write mode of a nonvolatile memory device.

On the other hand, second high voltage VPP2 is always activated regardless of a mode change of the nonvolatile memory device. Accordingly, second voltage VPP2 can be used as a source voltage for generating high voltage VPP1 or a drive voltage of first comparator 230. Moreover, where feedback voltage Vx is adjusted by first voltage divider 220, it is provided with a magnitude higher than external voltage Vext.

Under these conditions, voltage generator 170 promptly and sensitively detects a ripple in an output high voltage and feeds it back. Voltage generator 170 can resolve instabilities of a high voltage output due to a current peak in a write operation mode consuming a relatively large current.

Figure 11:
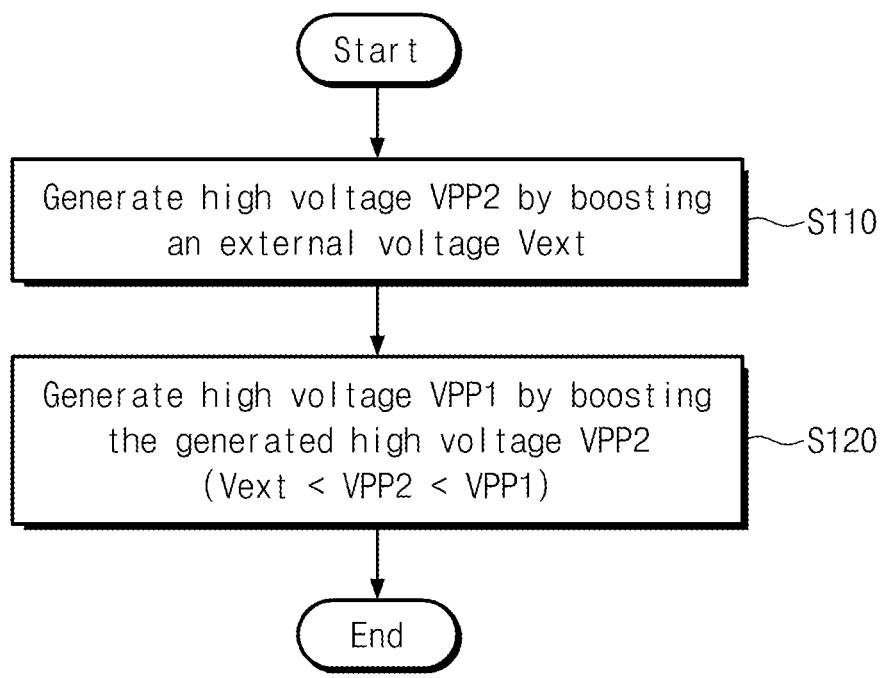
FIG. 11 is a flowchart illustrating a voltage generating method according to an embodiment of the inventive concept.

FIG. 11 is a flowchart illustrating a voltage generating method according to an embodiment of the inventive concept. The method of FIG. 11 uses second high voltage VPP2 to generate first high voltage VPP1 with a higher magnitude than second high voltage VPP2.

Referring to FIG. 11, in an operation S110, second booster 170b of FIG. 7 generates second high voltage VPP2 by boosting external voltage Vext. Second high voltage VPP2 generally is used in a read operation mode and a standby mode of a nonvolatile memory device. However, the second high voltage is activated in a write operation mode.

Next, in an operation S120, first booster 170a of FIG. 7 provides second high voltage VPP2 to first comparator 230 and first charge pump 210. At the same time, first high voltage VPP1 is provided to first voltage divider 220. First voltage divider 220 generates a feedback voltage Vx with a divide ratio. For example, first high voltage VPP1 can be voltage-divided with a 6:2 divide ratio and output as feedback voltage Vx. First comparator 230 compares feedback voltage Vx with a first reference voltage Vref1 and monitors a level of first high voltage VPP1. According to a monitoring result, first comparator 230 activates or deactivates first charge pump 210.

Figure 12:
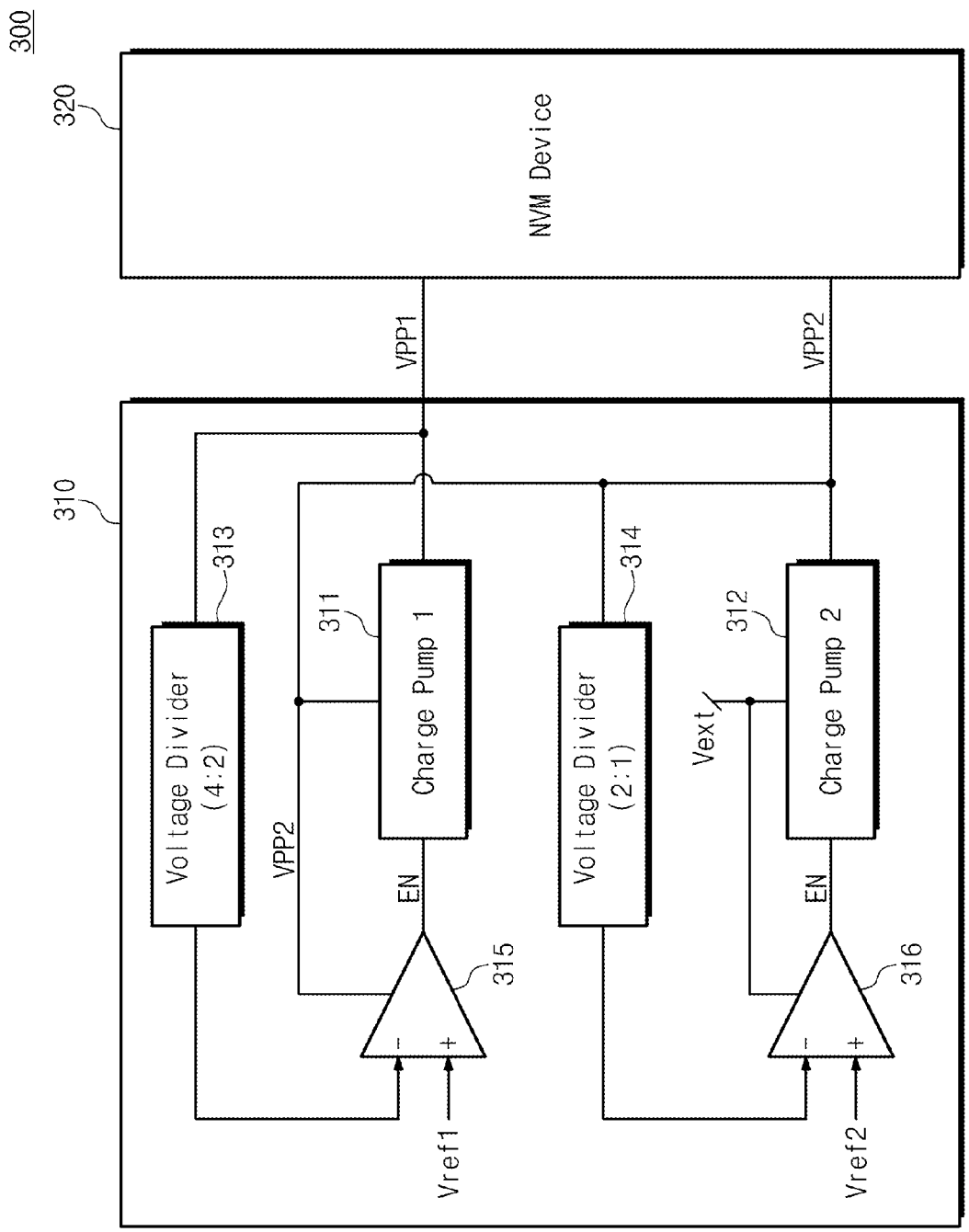
FIG. 12 is a block diagram illustrating a nonvolatile memory device according to an embodiment of the inventive concept.

FIG. 12 is a block diagram illustrating a nonvolatile memory device according to an embodiment of the inventive concept.

Referring to FIG. 12, voltage generator 310 is located outside nonvolatile memory device 320. The configuration of voltage generator 310 is substantially the same as voltage generator 170 of FIG. 7. Accordingly, the configuration and operations of voltage generator 310 will not be described in further detail.

Nonvolatile memory device 320 receives first high voltage VPP1 used in a write mode and second high voltage VPP2 used in a read or standby mode. In the example of FIG. 12, because there is no need for an additional high voltage generating unit therein, the chip size of the nonvolatile memory device may be reduced.

Figure 13:
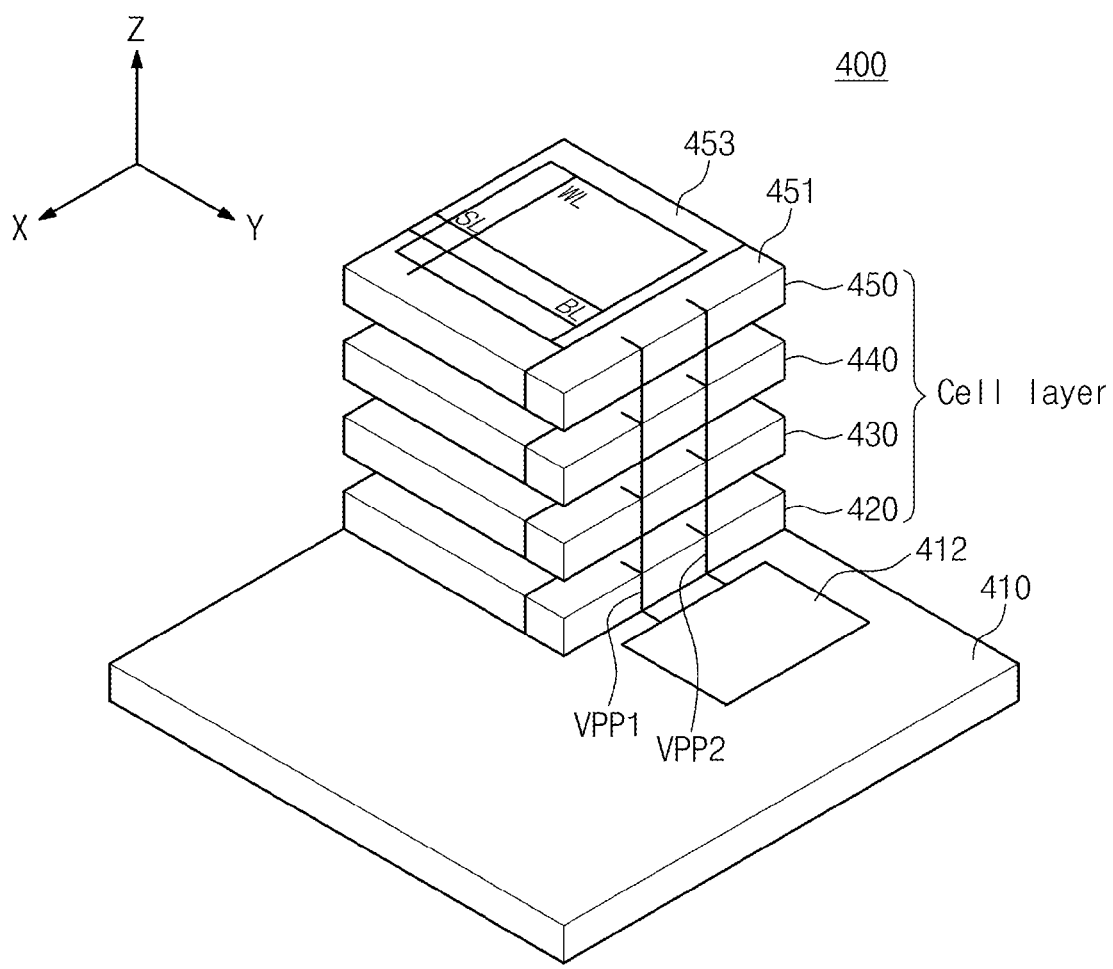
FIG. 13 is a perspective view illustrating a semiconductor memory device having a three-dimensional layer stacked structure according to an embodiment of the inventive concept.

FIG. 13 is a perspective view illustrating a semiconductor memory device having a three-dimensional layer stacked structure according to an embodiment of the inventive concept.

Referring to FIG. 13, semiconductor memory device 400 comprises an interface layer 410, and a plurality of cell layers 420, 430, 440, and 450 stacked on interface layer 410.

Interface layer 410 comprises interface circuits receiving a control signal and data from an external source. Interface layer 410 writes data input from an external source into cell layers 420, 430, 440, and 450. In addition, interface layer 410 reads data written in cell layers 420, 430, 440, and 450 in response to a request from an external source. In a write mode, first high voltage VPP1 is applied to provide a write pulse on selected memory cells. In a read mode and a standby mode, second high voltage VPP2, which is lower than first high voltage VPP1, is provided.

Interface layer 410 comprises a voltage generator 412 for providing first high voltage VPP1 and second high voltage VPP2. Voltage generator 412 is configured to use second high voltage VPP2 as a source voltage for generating first high voltage VPP1 and or a drive voltage. Voltage generator 412 can be implemented substantially the same as voltage generator 170 of FIG. 3 or 7. Although not shown in the drawings, one cell layer can be formed in interface layer 410.

Each of cell layers 420, 430, 440, and 450 comprises a memory cell region 453 and a logic region 451. Each of cell layers 420, 430, 440, and 450 is substantially the same as cell layer 450. Accordingly, only a description of cell layer 450 will be provided.

Logic region 451 comprises a write driver for writing a voltage and data provided from interface layer 410 on memory cell region 453. Logic region 451 comprises a sense amplifier for reading the data written on memory cell region 453 under the control of interface layer 410. Logic region 451 further comprises an address decoder. Logic region 451 generates a write pulse using first high voltage VPP1 during a write operation mode.

Memory cell region 453 comprises word lines WL and bit lines BL arranged in a row and column direction. Additionally, memory cell region 453 further comprises a source line SL disposed in a row direction or a column direction. Memory cells are disposed on intersection points of word lines WL and bit lines BL.

Where memory cell region 453 comprises a PRAM device, its memory cells can comprise one variable resistance device R and a switching device (e.g., a diode). Where memory cell region 453 comprises an RRAM, its memory cells can comprise a variable resistance device R or a switching device connected in series to one variable resistance device R.

In semiconductor memory device 400, voltage generator 412 can occupy a relatively large area on interface layer 410. However, the degree of integration in cell layers 420, 430, 440, and 450 can be increased.

Figure 14:
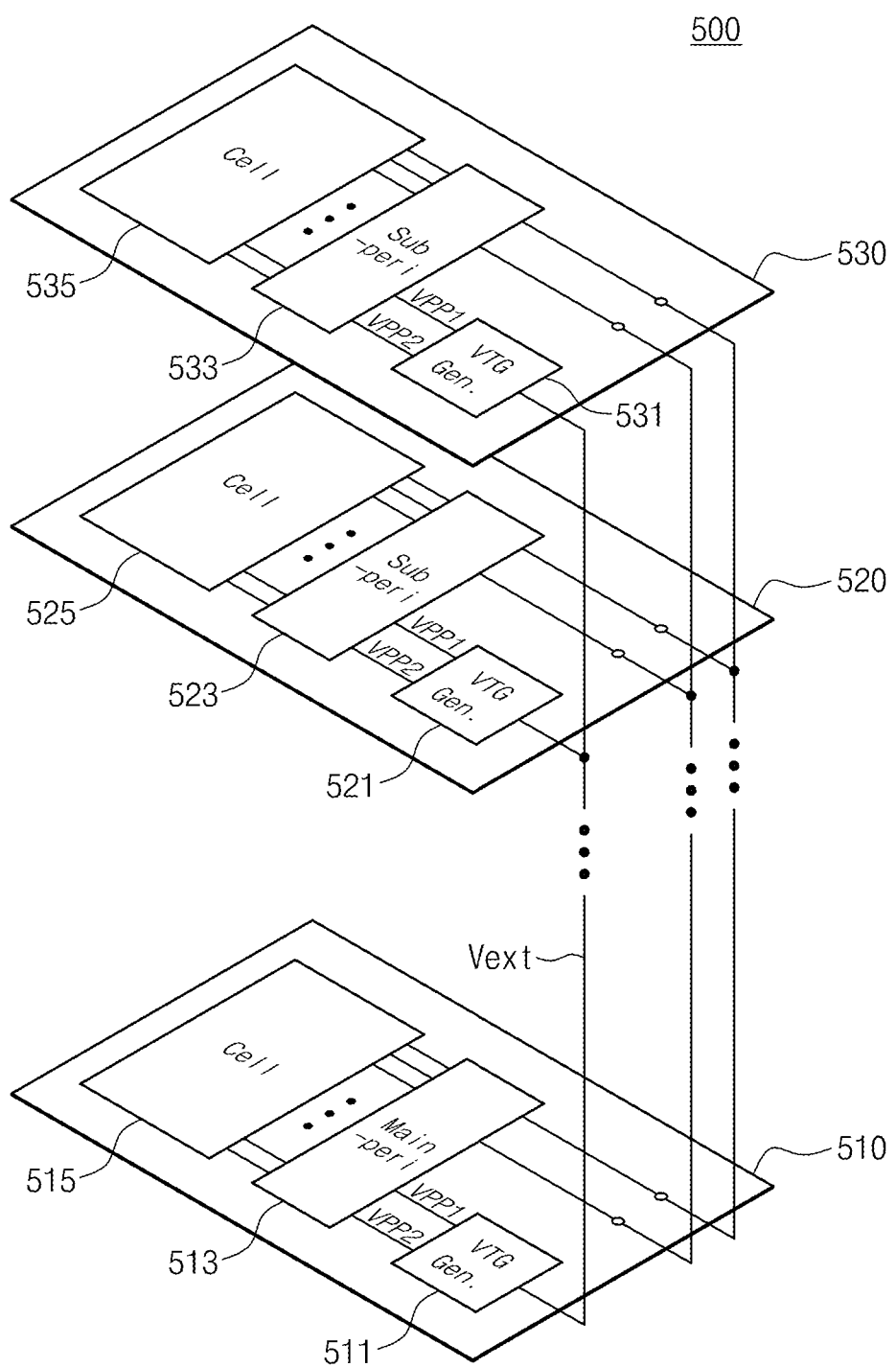
FIG. 14 is a perspective view illustrating a semiconductor memory device having a three-dimensional layer stacked structure according to an embodiment of the inventive concept.

FIG. 14 is a perspective view illustrating a semiconductor memory device having a three-dimensional layer stacked structure according to an embodiment of the inventive concept.

Referring to FIG. 14, semiconductor memory device 500 comprises a plurality of sequentially stacked cell layers 510, 520, and 530. Cell layers 510, 520, and 530 respectively comprise voltage generators 511, 521, and 531, peri-logics 513, 523, and 533, and cell arrays 515, 525, and 535.

Voltage generators 511, 521, and 531 receive external voltage Vext to generate first high voltage VPP1 and second high voltage VPP2. First high voltage VPP1 is used to provide a write pulse on selected memory cells in a write mode. In a read mode or a standby mode, second high voltage VPP2 lower than first high voltage VPP1 is provided. Each of voltage generators 511, 521, and 531 may be configured to use second high voltage VPP2 as a source voltage for generating first high voltage VPP1 and/or a drive voltage. Each of voltage generators 511, 521, and 531 can be substantially same as that voltage generator 170 of FIG. 3 or 7.

A plurality of peripheral logic units ("peri logics") 513, 523, and 533 comprise a main peri logic 513 and sub peri logics 523 and 533. Sub peri logics 523 and 533 are controlled by main peri logic 513. Peri logics 513, 523, and 533 are configured to allow cell layers 510, 520, and 530 to be accessed from an external device without conflict. Each of peri logics 513, 523, and 533 comprises a write driver, a sense amplifier, and an address decoder.

Cell arrays 515, 525, and 535 are accessed by peri logics 513, 523, and 533, respectively. Each of cell arrays 515, 525, and 535 comprises a nonvolatile memory device. For example, a memory device of each of cell arrays 515, 525, and 535 can comprise one of a PRAM, an RRAM, an NFGM, a PoRAM, an MRAM, or an FRAM.

In semiconductor memory device 500 having the three-dimensional layer stacked structure, cell layers 510, 520, and 530 comprise voltage generators 511, 521, and 531, respectively. Accordingly, each of cell layers 510, 520, and 530 receives a high voltage with relative stability.

Figure 15:
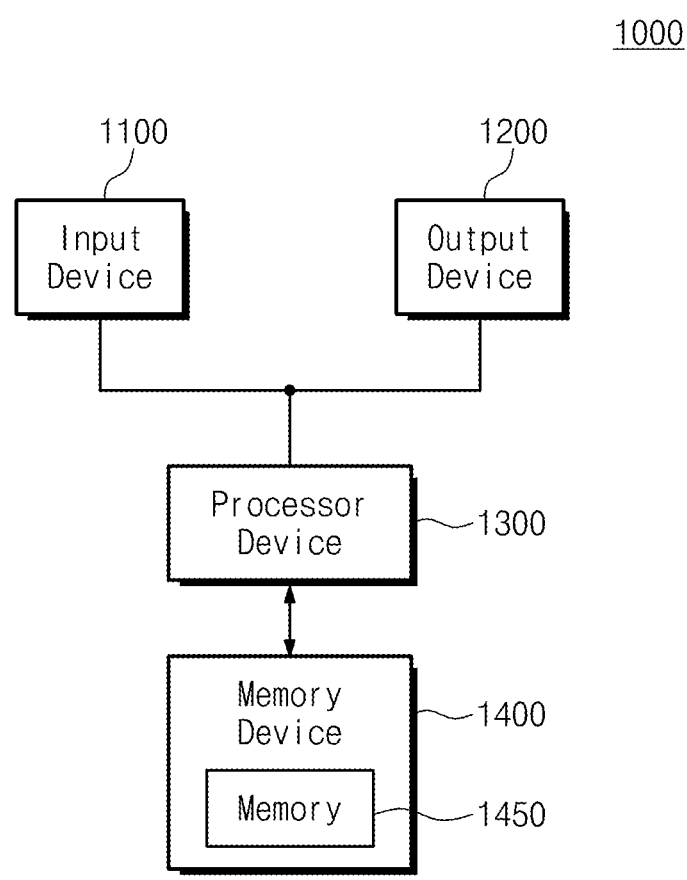
FIG. 15 is a block diagram illustrating an electronic system comprising a memory device according to an embodiment of the inventive concept.

FIG. 15 is a block diagram illustrating an electronic system 1000 comprising a memory device 1400 according to an embodiment of the inventive concept.

Referring to FIG. 15, electronic system 1000 comprises an input device 1100, an output device 1200, a processor device 1300, and a memory device 1400.

Memory device 1400 comprises a memory 1450 having a three-dimensional layer stacked structure and a voltage generator according to an embodiment of the inventive concept. In some embodiments, the voltage generator can be incorporated in a memory controller. Alternatively, the voltage generator can be incorporated in memory 1450.

A processor device 1300 controls input device 1100, output device 1200, and memory device 1400 through corresponding interfaces.

Figure 16:
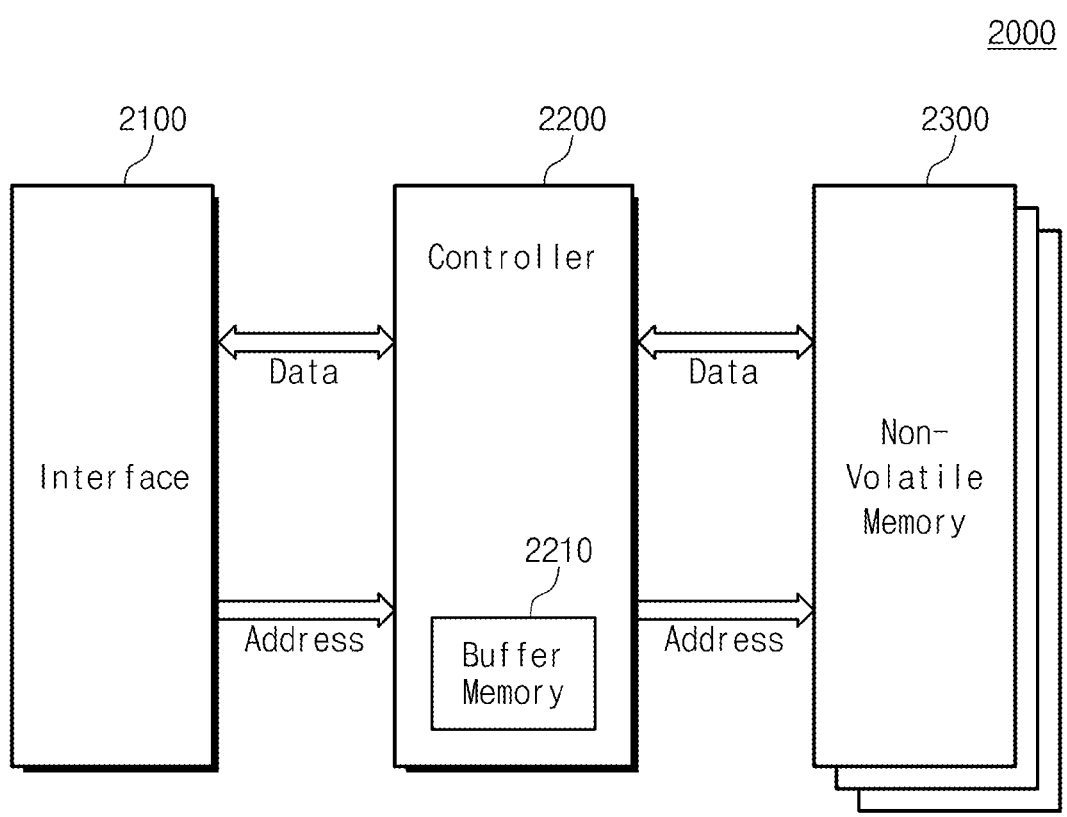
FIG. 16 is a block diagram illustrating a memory card according to an embodiment of the inventive concept.

FIG. 16 is a block diagram illustrating a memory card 2000 according to an embodiment of the inventive concept.

Referring to FIG. 16, memory card 2000 comprises an interface 2100, a controller 2200, and a nonvolatile memory 2300.

Interface 2100 facilitates communication between memory card 2000 and a host system (not shown). To this end, interface 2100 implements a data exchange protocol corresponding to the host. In various alternative embodiments, interface 2100 can be configured to communicate with a host through one of various interface protocols such as universal serial bus (USB), multi-media card (MMC), peripheral component interconnect-express (PCI-E), serial-attached SCSI (SAS), serial advanced technology attachment (SATA), parallel advanced technology attachment (PATA), small computer system interface (SCSI), enhanced small disk interface (ESDI), or integrated drive electronics (IDE).

Controller 2200 receives data and an address provided from an external device through interface 2100. Controller 2200 accesses nonvolatile memory 2300 according to data and an address provided from the host system. Controller 2200 delivers data read from nonvolatile memory 2300 to the host system through interface 2100. Controller 2200 comprises a buffer memory 2210.

Write data provided from a host or data read from nonvolatile memory device 2300 is temporarily stored in buffer memory 2210. Upon receiving a read request from the host system, if data in nonvolatile memory device 2300 is cached, buffer memory 2210 supports a cache function providing the cached data to a host directly. In general, a data transmission speed of a bus format used by the host system can be much faster than that of a memory channel of memory card 2000. The effects of this speed difference can be reduced, however, by temporarily buffering received data in buffer memory 2210.

Nonvolatile memory 2300 can be provided as a storage medium of memory card 2000. For example, nonvolatile memory 2300 can comprise a resistive memory device. Nonvolatile memory device 2300 can also comprise a NAND-type flash memory having a high storage capacity, or a plurality of memory devices. Where nonvolatile memory device 2300 comprises a plurality of memory devices, each memory device can be connected to controller 2200 by a channel unit. Nonvolatile memory device 2300 can also serve as a storage unit comprising a combination of one or more PRAM, MRAM, ReRAM, FRAM, or NOR flash memory.

In memory card 2000, the stability of first high voltage VPP1 provided in a write operation of nonvolatile memory 2300 is improved. Accordingly, the reliability of data stored in nonvolatile memory 2300 is improved.

Figure 17:
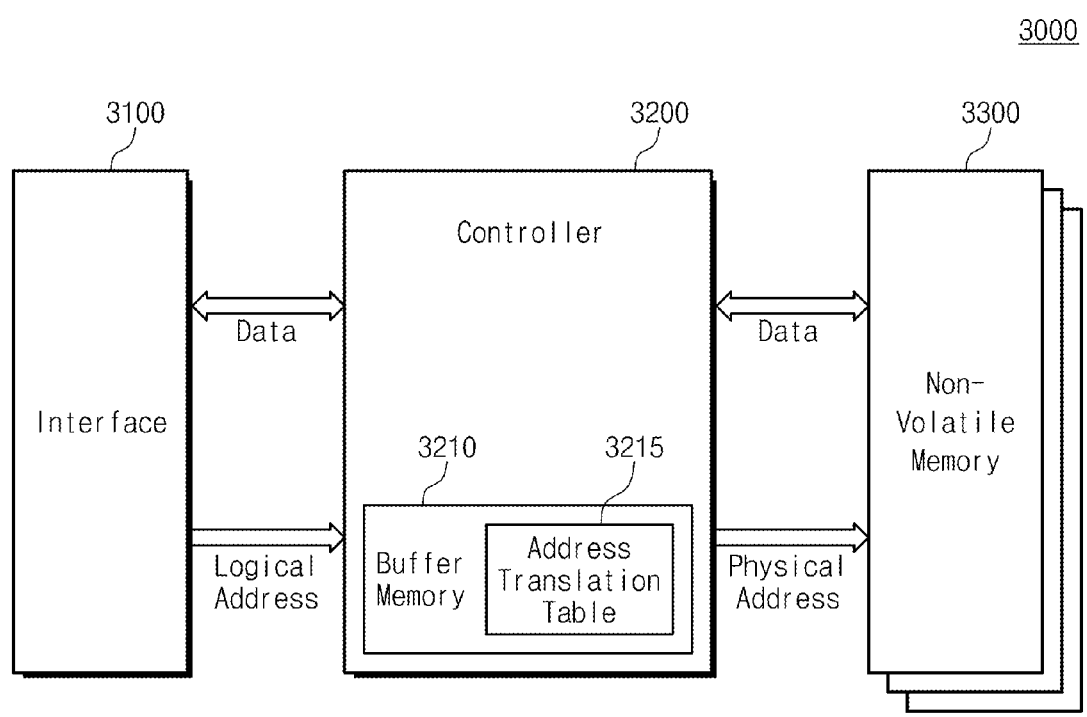
FIG. 17 is a block diagram illustrating a memory card according to an embodiment of the inventive concept.

FIG. 17 is a block diagram illustrating a memory card 3000 according to an embodiment of the inventive concept.

Referring to FIG. 17, memory card 3000 comprises an interface 3100, a controller 3200, and a nonvolatile memory 3300. The configuration of interface 3100 and nonvolatile memory 3300 are substantially the same as those of FIG. 15. Accordingly, a further description thereof will be omitted.

Controller 3200 comprises a buffer memory 3210 having an address translation table 3215. Controller 3200 translates a logical address provided from interface 3100 into a physical address by referring to address translation table 3215. Using the translated physical address, controller 3200 accesses nonvolatile memory device 3300.

In memory card 3000, the stability of a first high voltage VPP1 provided during a write operation of nonvolatile memory 3300 is improved. Accordingly, the reliability of data stored in nonvolatile memory 3300 is improved.

Memory cards 2000 and 3000 shown in FIGS. 16 and 17 can be incorporated in various types of devices, such as digital camera, a portable media player (PMP), a mobile phone, and an information processing device such as a notebook computer. Memory cards 2000 and 3000 can take various forms, such as an MMC card, a Secure Digital (SD) Card, a micro SD card, a memory stick, an ID card, a personal computer memory card international association (PCMCIA) card, a chip card, a USB card, a smart card, or a compact flash (CF) card.

Figure 18:
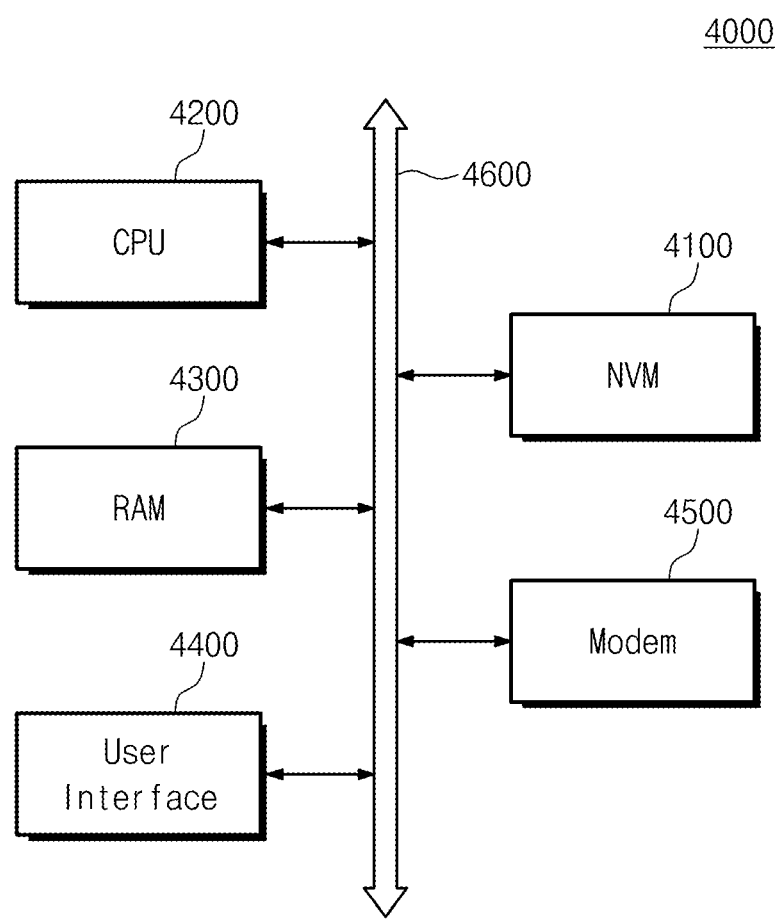
FIG. 18 is a block diagram illustrating a computing system according to an embodiment of the inventive concept.

FIG. 18 is a block diagram illustrating a computing system 4000 comprising a memory system 4100 according to an embodiment of the inventive concept.

Referring to FIG. 18, computing system 4000 comprises a central processing unit (CPU) 4200, a RAM 4300, a user interface 4400, a modem 4500 such as a baseband chipset, and a memory system 4100, which are electrically connected to a system bus 4600.

Memory system 4100 comprises at least one nonvolatile memory device using first high voltage VPP1 or second high voltage VPP2 provided from boosters for generating respectively different high voltages. Second high voltage VPP2 generated from one booster can be used as a source voltage for generating first high voltage VPP1 higher than second high voltage VPP2, or it can be used as a drive voltage.

Where computing system 4000 is a mobile device, a battery (not shown) for supplying an operating voltage of computing system 4000 can be additionally provided. Although not shown in the drawings, computing system 4000 can further comprise other components, such as an application chipset, a camera image processor (CIP), and a mobile DRAM. Memory system 4100 can also form a solid state drive (SSD) using a nonvolatile memory to store data. Alternatively, memory system 4100 can be provided as a fusion flash memory (e.g., a memory combined with a SRAM buffer, a NAND flash memory, and a NOR interface logic).

The above-described nonvolatile memory devices and/or a controller can be mounted in various types of packages. For example, a resistive memory device and/or a controller can be mounted in a package having a configuration such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, in a voltage generator or a nonvolatile memory device according to various embodiments of the inventive concept, a ripple of a generated high voltage is detected and removed. This can improve the reliability of a voltage generator providing a high voltage with a stable level or an access operation of a nonvolatile memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A voltage generator, comprising:
a first booster that generates a first high voltage; and
a second booster that generates a second high voltage by boosting an external voltage,
wherein the first booster comprises a comparator that controls a boosting operation with reference to a fed back version of the first high voltage and uses the second high voltage as a drive voltage.

2. The voltage generator of claim 1, wherein the first booster comprises a voltage divider that adjusts a level of the first high voltage to provide it as a feedback voltage.

3. The voltage generator of claim 2, wherein the feedback voltage is higher than the external voltage.

4. The voltage generator of claim 2, wherein the first booster comprises a charge pump that boosts the second high voltage to the first high voltage under control of the comparator.

5. The voltage generator of claim 1, wherein the first booster comprises a reference voltage generator that generates a reference voltage, and a trim circuit that trims the reference voltage to provide it as a reference input of the comparator.

6. A nonvolatile memory device comprising:
a memory cell array;
a write driver that writes data in the memory cell array;
a sense amplifier that reads data written in the memory cell array; and
a voltage generator that provides a first high voltage to the write driver and a second high voltage to the sense amplifier,
wherein the voltage generator comprises a comparator that controls a boosting operation with reference to a fed back version of the first high voltage and uses the second high voltage as a drive voltage.

7. The nonvolatile memory device of claim 6, wherein the voltage generator comprises:
a first booster that generates the first high voltage;
a second booster that generates the second high voltage by boosting an external voltage.

8. The nonvolatile memory device of claim 7, wherein the first booster comprises a voltage divider that adjusts a level of the first high voltage to provide the first high voltage as a feedback voltage.

9. The nonvolatile memory device of claim 8, wherein the feedback voltage is higher than the external voltage.

10. The nonvolatile memory device of claim 7, wherein the first booster comprises a charge pump that boosts the second high voltage to the first high voltage under control of the comparator.

11. The nonvolatile memory device of claim 7, wherein the first booster comprises:
a reference voltage generator that generates a reference voltage; and
a trim circuit that trims the reference voltage and provides it to the comparator.

12. The nonvolatile memory device of claim 6, wherein the second high voltage is activated in a read operation mode, a standby mode, or a write operation mode.

13. A method of operating a voltage generator, comprising:
operating a first booster to generate a first high voltage;
operating a second booster to generate a second high voltage by boosting an external voltage; and
controlling a boosting operation of the first booster using a comparator that compares a fed back version of the first boosting voltage with a reference voltage and uses the second high voltage as a drive voltage.

14. The method of claim 13, wherein the first booster comprises a voltage divider that adjusts a level of the first high voltage to provide the first high voltage as a feedback voltage.

15. The method of claim 14, wherein the feedback voltage is higher than the external voltage.

16. The method of claim 13, wherein the first booster comprises a charge pump that boosts the second high voltage to the first high voltage under control of the comparator.

17. The method of claim 13, wherein the first booster comprises a reference voltage generator that generates the reference voltage, and a trim circuit that trims the reference voltage and provides it to the comparator.

* * * * *